United States Patent [19]
Okamoto

[11] Patent Number: 5,923,196
[45] Date of Patent: Jul. 13, 1999

[54] BAND-SELECTABLE PHASE-LOCKED LOOP

[75] Inventor: Seiji Okamoto, Tokyo, Japan

[73] Assignee: Oki Electric Industry Co., Ltd., Tokyo, Japan

[21] Appl. No.: 08/829,176

[22] Filed: Mar. 31, 1997

[30] Foreign Application Priority Data

Aug. 29, 1996 [JP] Japan .................................. 8-204547

[51] Int. Cl.⁶ .............................. H03L 7/107; H03L 7/18
[52] U.S. Cl. ............................. 327/156; 327/147; 331/17
[58] Field of Search .................................. 327/155–158, 327/105, 115, 117, 113, 147, 148, 149; 331/17, 25, 34, 57

[56] References Cited

U.S. PATENT DOCUMENTS

| | | |
|---|---|---|
| 3,610,954 | 10/1971 | Treadway et al. . |
| 5,166,641 | 11/1992 | Davis et al. .............................. 331/17 |
| 5,475,326 | 12/1995 | Masuda .................................. 327/157 |
| 5,498,998 | 3/1996 | Gehrke et al. ............................ 331/17 |
| 5,534,823 | 7/1996 | Kondou .................................... 331/17 |

FOREIGN PATENT DOCUMENTS 344712  12/1992  Japan .

*Primary Examiner*—Timothy P. Callahan
*Assistant Examiner*—Eunja Shin
*Attorney, Agent, or Firm*—Wenderoth, Lind & Ponack, L.L.P.

[57] ABSTRACT

A PLL is provided which is capable of following an input frequency over an extensive range without incurring an increase in the size of circuit arrangement. The PLL 100 includes a band-selectable voltage-controlled oscillator, and a band selection controller. The band selection controller monitors a comparison output from a phase detector and an output from a low-pass filter to deliver a band selection signal, which switches an oscillation band of the voltage-controlled oscillator. Instead of using the band-selectable voltage controlled oscillator, a programmable frequency divider may be used, and its frequency division factor may be changed responsive to the band switching signal.

3 Claims, 7 Drawing Sheets

50 BAND SELECTION CONTROLLER

BAND-SELECTABLE PHASE-LOCKED LOOP

BACKGROUND OF THE INVENTION

The invention relates to a phase-locked loop (PLL) which multiplies an input signal frequency to a given value and delivers it as an output, and in particular, to a PLL in which the output follows the input signal frequency over an extensive frequency range.

A PLL frequency synthesizer circuit is used in a tuning circuit of a mobile communication equipment such as a digital cordless telephone or a portable telephone. The PLL frequency synthesizer circuit is an oscillator which can oscillate at a number of exact frequencies which are spaced apart at an equal interval, and is indispensable as a local oscillator in a mobile communication equipment.

A PLL of the kind described is disclosed, for example, in Japanese Laid-Open Patent Application No. 344,712/92 which discloses a PLL synchronization signal generator. This arrangement aims at reliably producing an output signal which is synchronized with an input signal whose frequency varies over an extensive range, and includes a plurality of combinations of low-pass filters (LPFs), each having a given frequency bandwidth, and associated voltage-controlled oscillators (VCOs), as well as a frequency measuring circuit which determines the frequency of an input signal. The result of the measurement by the frequency measuring circuit is used to operate a switch to select one of the outputs of the combinations of the LPFs and the VCOs.

However, the above-described PLL, synchronization signal generator requires a plurality of combinations of the LPFs and the VCOs, and the frequency measuring circuit, and is therefore undesirably complex and voluminous.

SUMMARY OF THE INVENTION

It is an object of the invention to provide a PLL which is capable of following an input frequency over an extensive range without increase in the size of the circuit.

A PLL according to the invention comprises a phase detector, a low-pass filter 1 The a variable frequency generating circuit has an output frequency that varies in response to the output of the low-pass filter. The a band selection controller is operable for monitoring a comparison output from the phase detector and an output from the low-pass filter, to deliver a band selection signal which is effective to switch a factor for converting the output of the low-pass filter to the frequency of the output of the variable frequency generating circuit.

The variable frequency generating circuit may comprise a voltage-controlled oscillator of a type whose oscillation band is selectable, and the oscillation band may be selected in accordance with the band selection signal.

The variable frequency generating circuit may alternatively comprise a frequency divider of a type whose frequency division factor is selectable, and the frequency division factor of the frequency divider may be switched in accordance with the band selection signal.

The PLL of the above configuration can be formed of a smaller number of components, and yet is capable of following an input frequency over an extensive range.

DETAILED DESCRIPTION OF THE PREFERRED EMBODIMENTS

Figure 1:
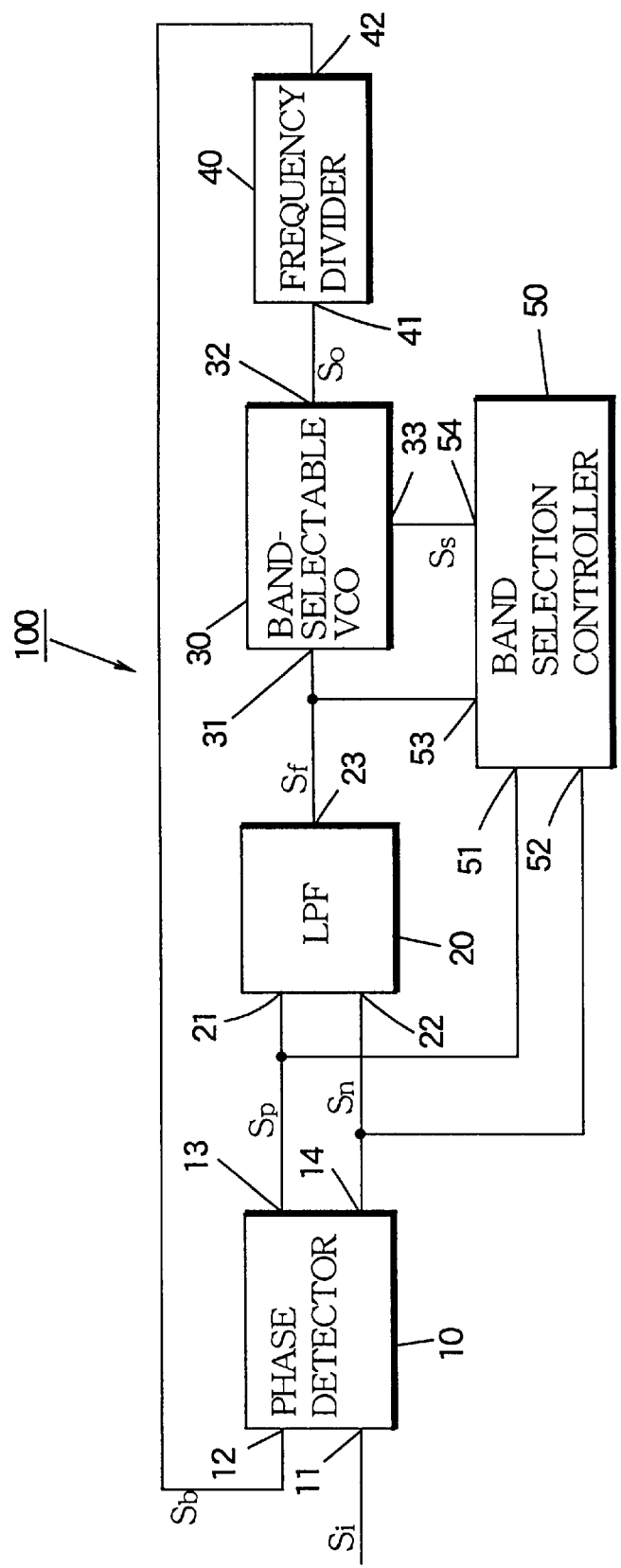
FIG. 1 is a circuit diagram of a PLL according to a first embodiment of the invention.

A PLL according to the invention can be used in a mobile communication terminal or the like. FIG. 1 shows a PLL according to a first embodiment of the invention. Referring to FIG. 1, a PLL 100 comprises a phase detector 10, a low-pass filter (LPF) 20, a band-selectable voltage-controlled oscillator (VCO) 30 (i.e., a VCO of a type whose oscillation band is selectable), a frequency divider 40 and a band selection controller 50.

An input signal Si is applied to a first input terminal 11 of the phase detector 10, a second input terminal 12 of which is connected to receive a feedback signal Sb from an output terminal 42 of the frequency divider 40.

In the following description, the feedback signal Sb is also called a second input signal, while the input signal Si is also called a first input signal, for distinction.

The phase detector 10 produces a first output signal Sp at a first output terminal 13 which is connected to a first input terminal 21 of the LPF 20 and to a first input terminal 51 of the band selection controller 50. The phase detector 10 also produces a second output signal Sn at a second output terminal 14 which is connected to a second input terminal 22 of the LPF 20 and to a second input terminal 52 of the band selection controller 50.

The LPF 20 produces an output signal Sf at an output terminal 23, which is connected to an input terminal 31 of the VCO 30 and to a third input terminal 53 of the band selection controller 50.

The VCO 30 produces an output signal So at an output terminal 32 which is connected to an input terminal 41 of the frequency divider 40. The VCO 30 also has a control terminal 33 which is connected to receive a band selection signal Ss from an output terminal 54 of the band selection controller 50.

In this manner, the PLL 100 of the first embodiment comprises the VCO 30 which is arranged to switch the oscillation band in accordance with the band selection signal Ss received at the terminal 33, and the band selection controller 50 which monitors the outputs Sp and Sn of the phase detector 10 indicating the result of the phase comparison, and the output signal Sf from the LPF 20, and delivers the band selection signal Ss which is used for selecting the oscillation band of the VCO 30.

Figure 2:
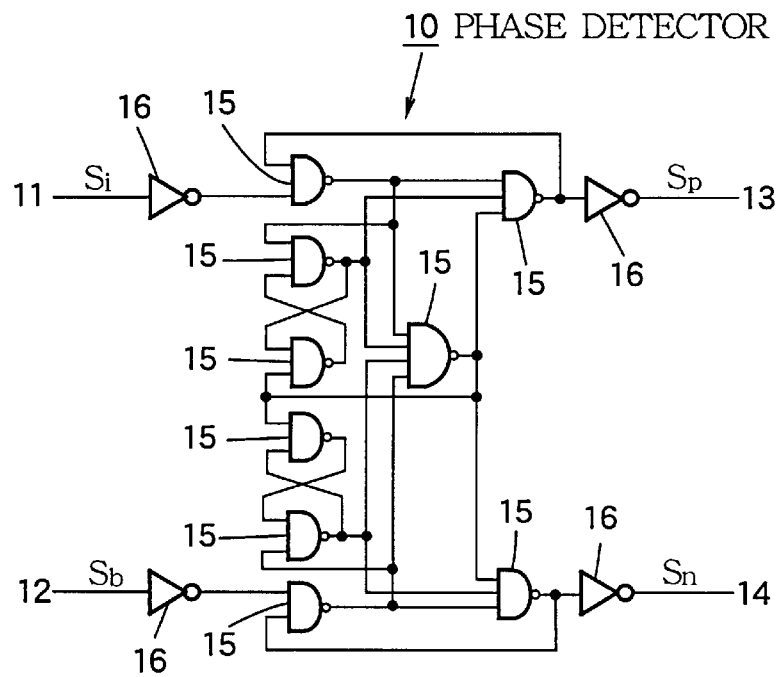
FIG. 2 is a circuit diagram specifically illustrating a phase detector used in the PLL.

FIG. 2 is a circuit diagram of the phase detector 10, which is known in itself. Referring to FIG. 2, the phase detector 10 comprises a plurality of NAND gates 15 and inverters 16, which are connected to each other and to the input terminals 11, 12 and output terminals 13, 14, in the manner illustrated.

The phase detector 10 operates in response to rising edges of the signal Si or Sb, and the operation does not depend on a duty cycle or an amplitude. In short, the phase detector 10 produces output signals at the first output terminal 13 when the first input signal Si has a higher frequency than or is leading in phase the second input signal Sb, and produces output signals at the second output terminal 14 when the second input signal Sb has a higher frequency than or is leading in phase the first input signal Si.

Specifically, when the first input signal Si has a higher frequency than or is leading in phase the second input signal Sb, the first output signal Sp repeats going High and returning Low at a frequency of the second input signal Sb. More specifically, the first output signal Sp repeats returning Low at a rising edge of the second input signal Sb, and rising High at a subsequent rising edge of the first input signal Si. When the first input signal Si does not have a higher frequency, and it is not leading in phase, the first output signal Sp is maintained Low. Similarly, when the second input signal Sb has a higher frequency than or is leading in phase the first input signal Si, the second output signal Sn repeats going High and returning Low at a frequency of the first input signal Si. More specifically, the second output signal Sn repeats returning Low at a rising edge of the first input signal Si, and rising High at a subsequent rising edge of the second input signal Sb. When the second input signal Sb does not have a higher frequency, and it is not leading in phase, the second output signal Sn is maintained Low.

An example of such a phase comparator is shown in U.S. Pat. No. 3,610,954 issued to Ronald L. Treadway on Oct. 5, 1971, which is incorporated herein by reference.

Figure 3:
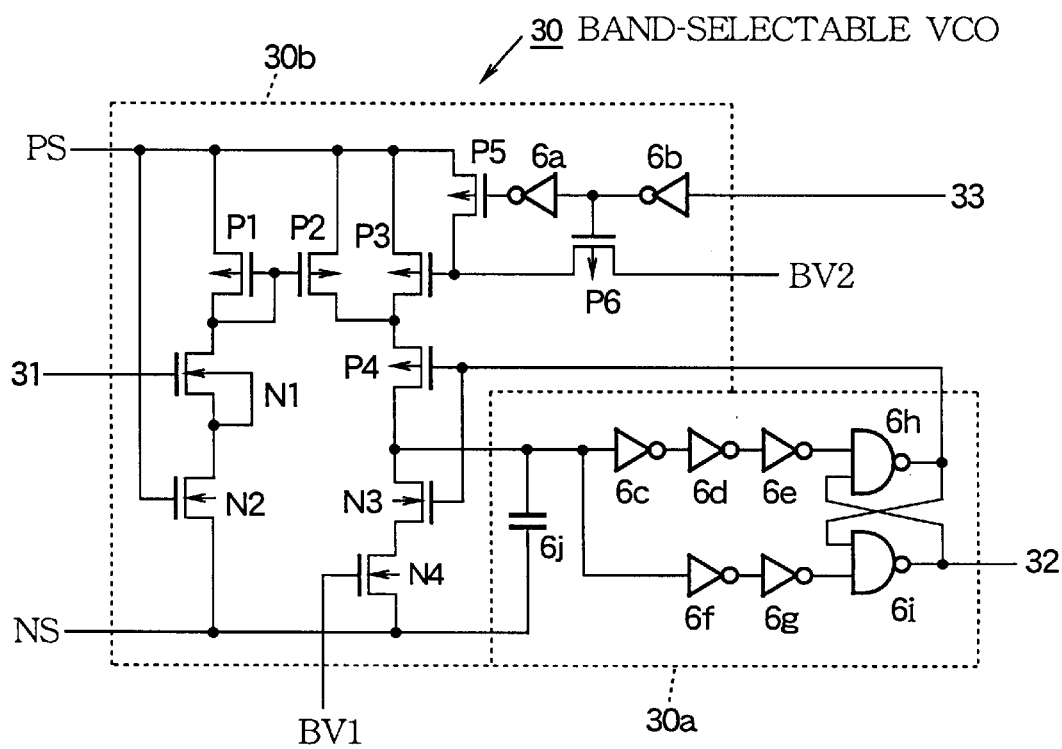
FIG. 3 is a circuit diagram of an example of a band-selectable VCO used in the PLL.

FIG. 3 is a circuit diagram of an example of the VCO 30. The characteristic of the VCO 30 and its operation will be later described with reference to FIG. 5.

Referring to FIG. 3, the input terminal 31 is connected to the gate electrode of an NMOS transistor (hereafter abbreviated as NMOS) N1, while the substrate and the source electrode of NMOS N1 are connected to the drain electrode of NMOS N2. The drain electrode of NMOS N1 is connected to the drain and gate electrodes of PMOS transistor (hereafter abbreviated as PMOS) P1 and to the gate electrode of PMOS P2.

The drain electrode of PMOS P2 is connected to the drain electrode of PMOS P3 and to the source electrode of PMOS P4. The gate electrode of PMOS P3 is connected to the drain electrodes of PMOSs P5 and P6. The gate electrode of PMOS P5 is connected to an output of an inverter 6a. The gate electrode of PMOS P6 is connected to the output of an inverter 6b, while the source electrode of PMOS P6 is connected to a bias voltage BV2.

The gate electrode of PMOS P4 is connected to the output of two-input NAND gate 6h, while the drain electrode thereof is connected to a drain electrode of NMOS N3, to the input of an inverter 6c, to the input of an inverter 6f, and a first electrode of an oscillation capacitor 6j. The gate electrode of NMOS N3 is connected to the output of the two-input NAND gate 6h, while the source electrode thereof is connected to the drain electrode of NMOS N4, the gate electrode of which is connected to a bias voltage BV1.

The output of the inverter 6c is connected to the input of an inverter 6d, the output of which is in turn connected to the input of an inverter 6e, the output of which is in turn connected to a first input of the two-input NAND gate 6h.

The output from the inverter 6f is connected to the input of an inverter 6g, the output of which is in turn connected to a first input of a two-input NAND gate 6i.

The output of the two-input NAND gate 6h is connected to a second input of the two-input NAND gate 6i, the output of which is in turn connected to a second input of the two-input NAND gate 6h, and output terminal 32.

A control signal input terminal 33 is connected to the input of the inverter 6b, the output of which is in turn connected to the input of the inverter 6a. The source electrodes of PMOSs P1, P2, P3 and P5 and the gate electrode of NMOS N2 are connected to a positive power supply PS, while the source electrodes of NMOSs N2 and N4 and a second electrode of the capacitor 6j are connected to a negative power supply or a ground potential NS.

In the VCO 30 thus constructed, the inverter 6c has a threshold voltage which is chosen to be higher than that of the inverter 6f.

A combination of the oscillation capacitor 6j, the inverters 6c to 6g and the two-input NAND gates 6h, 6i together form an oscillation circuit 30a, while a combination of NMOS N1 to N4, PMOS P1 to P6 and the inverters 6a, 6b together form a control circuit 30b. An oscillation frequency of the VCO 30 is determined by the value of the current which charges or discharges the capacitor 6j, the capacitance of the capacitor 6j, and a voltage difference between the threshold voltages of the inverters 6c and 6f. A terminal voltage across the capacitor 6j and an output waveform from the output terminal 32 will be described later with reference to FIG. 8A and FIG. 8B.

Figure 4:
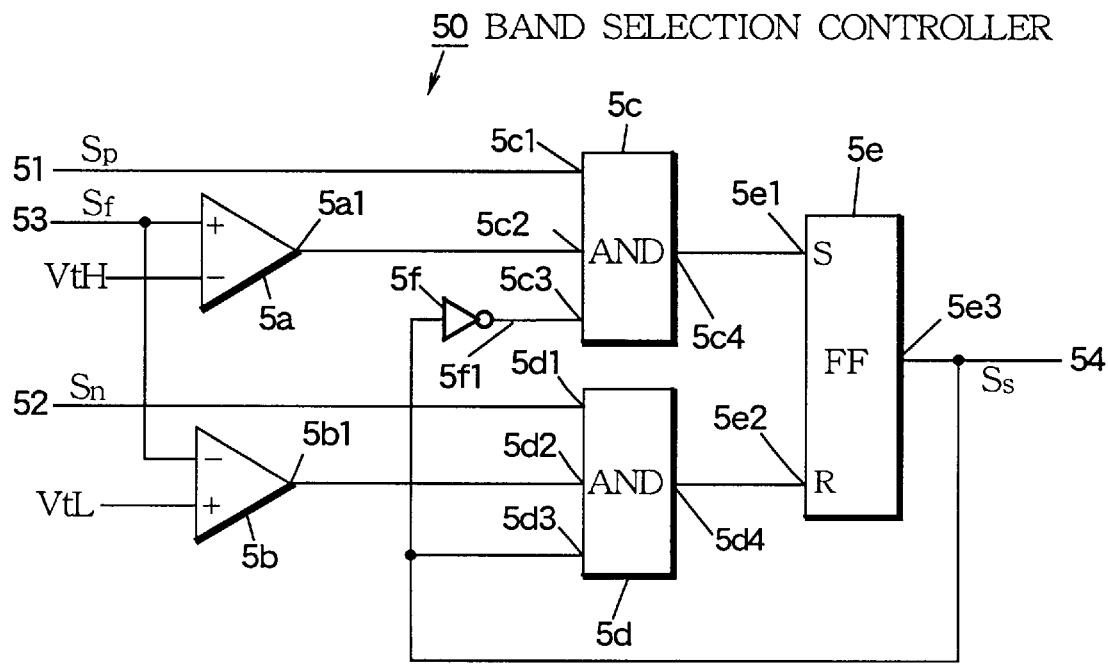
FIG. 4 is a circuit diagram of an example of a band selection controller used in the PLL.

FIG. 4 is a circuit diagram of an example of the band selection controller 50. The band selection controller 50 comprises a first voltage comparator 5a, a second voltage comparator 5b, a first AND gate 5c, a second AND gate 5d, a set/reset-type flip-flop 5e and an inverter 5f. Input and output terminals are denoted by like numerals as in FIG. 1.

The first voltage comparator 5a has a non-inverting input terminal which is connected to the third input terminal 53, an inverting input terminal which is connected to a first reference voltage VtH, and an output terminal 5a1 which is connected to a second input terminal 5c2 of the first AND gate 5c. The second voltage comparator 5b has an inverting input terminal which is connected to the third input terminal 53, a non-inverting input terminal which is connected to a second reference voltage VtL, and an output terminal 5b1 which is connected to a second input terminal 5d2 of the second AND gate 5d.

The first AND gate 5c further includes a first input terminal 5c1 which is connected to the first input terminal 51, a third input terminal 5c3 which is connected to an output 5f1 of the inverter 5f, and an output terminal 5c4 which is connected to a set terminal (S) of the flip-flop 5e.

Similarly, the second AND gate 5d further includes a first input terminal 5d1 which is connected to the second input terminal 52, a third input terminal 5d3 which is connected to an output terminal 5e3 of the flip-flop 5e, and an output terminal 5d4 which is connected to a reset terminal (R) 5e2 of the flip-flop 5e.

The operation of the PLL 100 constructed in the manner described above will be described below.

Referring to FIGS. 1 and 2, when the first input signal Si has a higher frequency than or is leading in phase the second input signal Sb, the first output signal Sp is intermittently High, and the second output signal Sn is maintained Low. When the first input signal Si has a lower frequency or is lagging in phase behind the the second input signal Sb, the first output signal Sp is maintained Low, and the second output signal Sn is intermittently High. The repetition cycle of the first or second output signal Sp or Sn going High and Low is equal to the lower one of frequencies of the two input signals.

When the first and second input signals Si and Sb are of the same frequency, and there is a phase difference between them, the period for which the first or second output signals Sp or Sn is High in each cycle is equal to the phase difference.

The LPF 20 functions to deliver a d.c. voltage by smoothing its input signals Sp and Sn. Its output Sf is increased when the input Sp applied to the first input 21 is High, and is decreased when the input Sn applied to the second input terminal 22 is High.

The voltage-controlled oscillator 30 of this embodiment can oscillate in a first or a second oscillating band. The VCO 30 delivers the signal So, at its output terminal 32, having a frequency which is substantially proportional to the voltage of the input signal Sf applied to the input terminal 31. When the band selection signal Ss applied to the control terminal 33 is Low, the lower oscillation band is selected. When the band selection signal Ss is High, the higher oscillation band is selected. The output So of the oscillator 30 is input to the frequency divider 40, which divides the input signal frequency applied to the input terminal 41, and delivers the frequency-divided output signal Sb from its output terminal 42.

Figure 5:
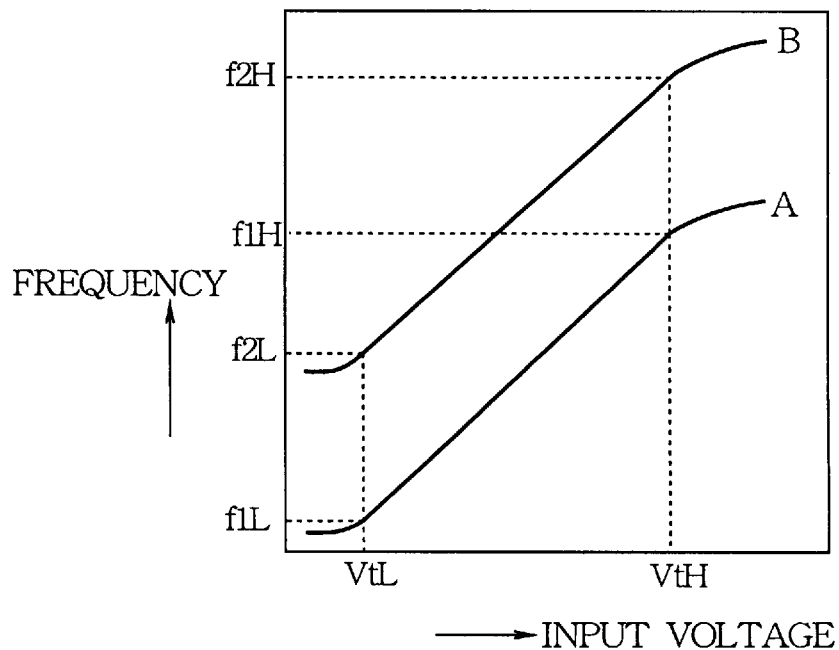
FIG. 5 illustrates the characteristic of the VCO used in the PLL.

FIG. 5 illustrates the characteristic of the band-selectable VCO 30, the abscissa indicating an input voltage and the ordinate indicating an oscillation frequency. As shown in FIG. 5, a curve A illustrates an input voltage versus output frequency characteristic for the low oscillation band. It will be seen that a region from f1L to f1H is a range which exhibits a good linearity with respect to the input voltage and which is suitable for actual use. Curve B similarly illustrates an input voltage versus output frequency characteristic for the high oscillation band. It will be seen that a region of f2L to f2H is a range which exhibits a good linearity with respect to the input voltage and which is suitable for actual use.

Returning to FIG. 1, the band selection signal Ss at the output terminal 54 of the band selection controller 50 is set to be Low or High depending on the status and history (past events) of the first, the second and the third input terminals 51, 52 and 53. If the band selection signal Ss is Low, it is changed to High only when the the voltage of the signal Sf applied to the input terminal 53 exceeds a certain, first threshold value. If the output is High, it is changed to Low only when the voltage of the signal Sf becomes lower than a certain, second threshold value.

The operation will be described in further detail with reference to the timing charts shown in FIGS. 6A to 6F, and 7A to 7F, which illustrate input and output signals of the phase detector 10, and output signals of the LPF 20 and the band selection controller 50, the abscissa representing the time. FIGS. 6A to 6F illustrate the operation when no change of the oscillation band takes place, while FIGS. 7A to 7F illustrate the operation in which a change of the oscillation band takes place.

First it is assumed that the band selection signal Ss from the band selection controller 50 is initially Low and the input/output characteristic as indicated by the curve A shown in FIG. 5 is therefore selected by the VCO 30. It is also assumed that the frequency of the second input signal Sb (which is the VCO output frequency as divided by the frequency divider 40), shown in FIG. 6B, applied to the second input terminal 12 of the phase detector 10 is a little lower than the frequency of the first input signal Si applied to the first input terminal 11, shown in FIG. 6A.

Because the second input signal Sb has a lower frequency than the first input signal Si, the first output signal Sp is High for an interval from t1 to t2.

Figure 6:
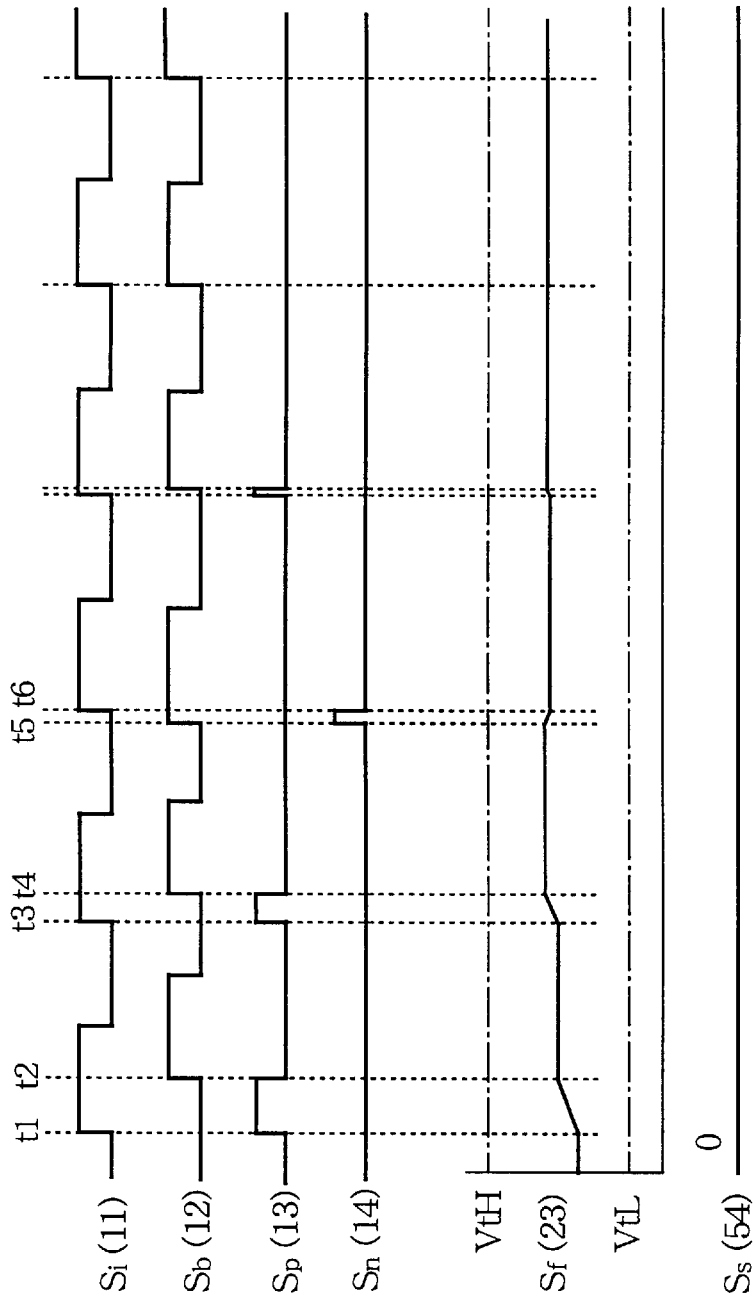
FIG. 6A to FIG. 6F are timing charts illustrating input and output signals of the phase detector, and output signals of the LPF and the band selection controller of the PLL.

While the first output signal Sp, which is applied to the first input terminal 21 of the LPF 20, is High, the output Sf of the LPF 20 is increased as shown in FIG. 6E, after t2, the output Sf is substantially unchanged (i.e., maintains the level which prevails at t2).

The oscillation frequency of the VCO 30 which receives the output Sf from the LPF 20 as its input changes in proportion to the input voltage, and accordingly, in the present example, the oscillation frequency increases as the output voltage Sf from the LPF 20 rises. As a result, the phase difference at the next rising edges (which occur at t3, t4) of the first and the second input signals Si and Sb may be reduced, as shown in FIG. 6A and FIG. 6B.

However, as the rising edge (at t3) of the first input signal Si is still leading the rising edge (at t4) the second input signal Sb, the first output signal Sp is High for an interval from t3 to t4. As a consequence, the output from the LPF 20 rises again, and the output frequency of the VCO 30 rises accordingly.

If, as a result of the increase of the output frequency of the VCO 30, the second input signal Sb becomes to lead the first input signal Si, and the rising edge (t5) of the second input signal Sb occurs earlier than the rising edge (t6) of the first input signal Si, then the second output signal Sn becomes High for a period from the rising edge (t5) of the second input signal Sb to the rising edge (t6) of the first input signal Si. The output from the LPF 20 falls for the interval t5 to t6, causing the output frequency of the VCO 30 to decrease accordingly.

A similar operation is thereafter repeated until the phase difference between the first and the second input signal to the phase detector 10 is eliminated, or to keep the phase difference to a minimum.

During the above described operation, the output voltage from the LPF 20 remains between predetermined threshold values VtH and VtL shown in FIG. 6E, so that the band selection signal Ss from the band selection controller 50 remains to be Low, and the oscillation band of the VCO is not changed.

The description of the operation will be continued with reference to FIG. 7A to FIG. 7F, for a situation in which the frequency of the first input signal Si is increased substantially, and the change of the oscillation band is required.

Here, it is assumed that the frequency of the first input signal Si is higher than the frequency f1H as divided by the frequency divider 40 but lower than the oscillation frequency f2H of the VCO 30 as divided by the frequency divider 40, and that the band selection signal Ss from the band selection controller 50 is initially Low as before, so that an input/output characteristic as indicated by the curve A shown in FIG. 5 is initially selected by the VCO 30.

Figure 7:
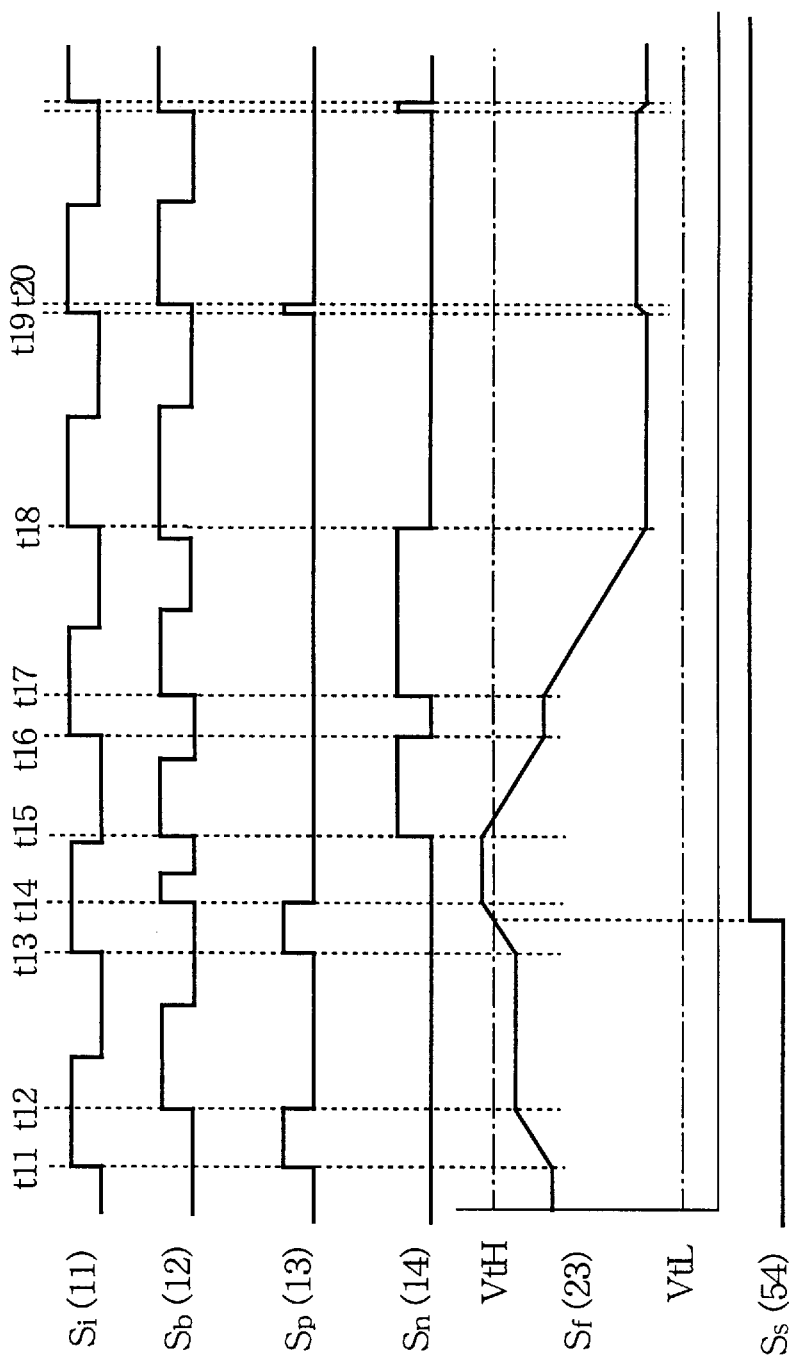
FIG. 7A to FIG. 7F are timing charts, similarly illustrating input and output signals of the phase detector and output signals of the LPF and the band selection controller.

If the second input signal Sb is lagging behind the first input signal Si, the first output Sp is High for an interval from t11 to t12, as shown in FIG. 7C, and accordingly, the output voltage from the LPF 20 rises, and the output frequency of the VCO 30 accordingly rises.

With the increase of the frequency of the VCO 30, the phase difference between the input signals Si and Sb may be reduced, but the second input signal Sb may still be lagging behind the first input signal Si, and the first output signal Sp is High for an interval from t13 to t14.

Then, the first output signal Sp is High from t13 to t14, and the LPF output is again increased, and the VCO output frequency is again increased.

If the output Sf of the LPF 20 exceeds a threshold level VtH, the band selection signal Ss (shown in FIG. 7F) output from the band selection controller 50 is changed from Low to High, because the condition for the change from Low to High described earlier in connection with the band selection controller 50 is met.

When the band selection signal Ss becomes High, the VCO 30, which uses this band selection signal Ss for selecting the oscillation band, changes the input/output characteristic from that indicated by the curve A to that indicated by a curve B shown in FIG. 5. Since the input voltage to the VCO 30 is substantially equal to VtH, the oscillation frequency changes from f1H to f2H. As a consequence, the output frequency of the frequency divider 40 also rises.

If, as a result of the increase of the output frequency of the VCO, the second input signal Sb becomes to lead the first input signal Si, and the rising edge (t15) of the second input signal Sb occurs earlier than the rising edge (t16) of the first input signal Si, the second output signal Sn of the phase detector 10 is High for an interval from t15 to t16, and the output of the LPF 20 is decreased, and the output frequency of the VCO 30 is also lowered.

At the next rising edges (t17, t18) of the first and second input signals Si and Sb, the second input signal Sb may still be leading the first input signal Si, as shown at t17 and t18, so that the output of the LPF 20 is decreased, and the output frequency of the VCO 30 is lowered.

At the next rising edges (at t19, t20) of the first and second input signals Si, Sb, the second input signal Sb may be lagging a little behind the first input signal Si. Then, the first output signal Sp of the phase detector 10 is High from t19 to t20, and the output of the LPF 20 is increased a little, and the output frequency of the VCO 30 is increased a little.

Similar operations are repeated until the phase difference between the first and second input signals Si and Sb of the phase detector diminishes, i.e., the there is no frequency difference, or to maintain the phase difference to a minimum.

Once an input/output characteristic as illustrated by the curve B is selected in the VCO 30, the switching operation to the curve A occurs only if the output frequency of the VCO becomes less than f2L.

Figure 8:
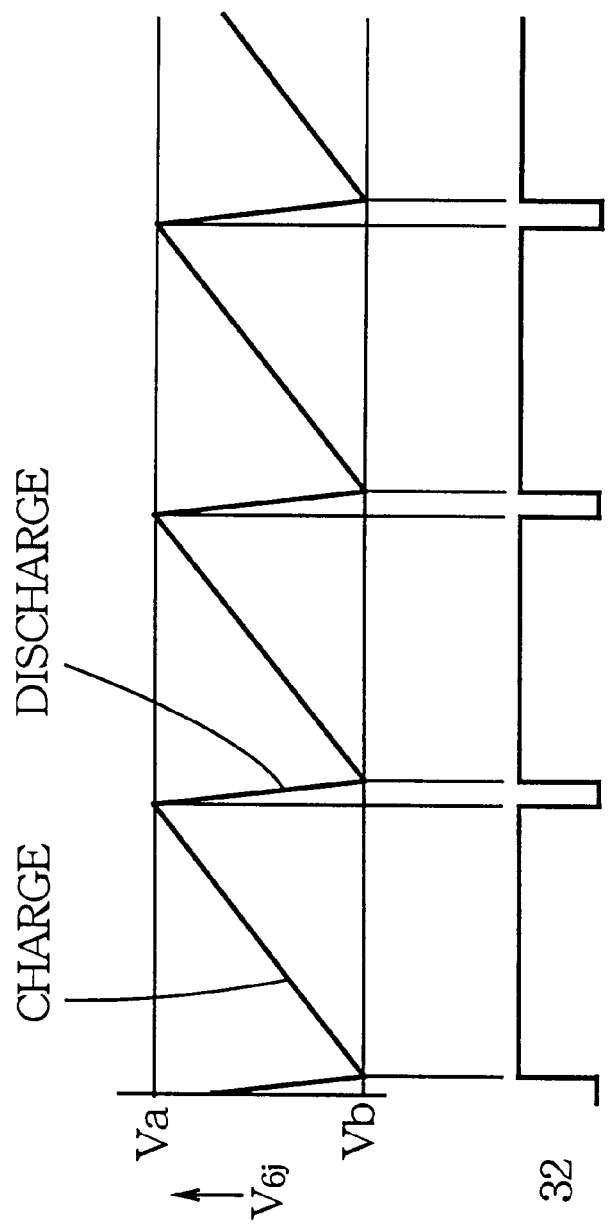
FIG. 8A and FIG. 8B illustrate a manner of oscillation of the VCO of the PLL.

FIG. 8A and FIG. 8B illustrate the manner of oscillation of the VCO 30, specifically showing a terminal voltage V6j across the capacitor 6j and an output waveform from the output terminal 32. In FIG. 8A, Va represents a threshold voltage or the inverter 6c, and Vb a threshold voltage of the inverter 6f. A discharge current is determined by the bias voltage BV1 and the conductance of NMOS N4. The magnitude of a charging current is the sum of a current value determined by the magnitude of an input voltage and the conductance of NMOS N1 and a current value determined by the bias voltage BV2 and the conductance of PMOS P3.

Referring to FIG. 3, it will be seen that when the selection signal Ss at the control terminal 33 is Low, PMOS P5 is conductive while PMOS P6 is non-conductive, and hence there is no current flow through PMOS P3. Thus, the charging current is determined by NMOS N1 and the input voltage. When the band selection signal Ss at, the control terminal 33 is High, PMOS P5 is non-conductive while PMOS P6 is conductive, and hence the gate voltage applied to the PMOS P3 is equal to the bias voltage BV2, and there is a current flow through the PMOS P3 which is determined by the bias voltage BV2 and the conductance of PMOS P3. The charging current through the capacitor 6j becomes equal to the sum of the respective current flows. In other words, a current flow of a constant magnitude is added to the current flow which depends on the input voltage, and therefore the oscillation frequency becomes higher by an amount corresponding to the added current flow. In this manner, the oscillation band of the VCO 30 can be switched by the band selection signal Ss applied to the control terminal 33.

As described above, the PLL 100 according to the first embodiment comprises the band-selectable VCO 30, and the band selection controller 50. The band selection controller 50 monitors the outputs Sp and Sn of the phase detector 10 and the output Sf from the LPF 20 to deliver the band selection signal Ss, which is effective to switch the oscillation band of the VCO 30. Accordingly, there is obtained a PLL which is capable of following the input frequency over an extensive range. Since a plurality of combinations of LPFs and VCOs as well as a frequency measuring circuit, which are used in a prior art arrangement, are dispensed with, the PLL can be realized as a circuit arrangement of a reduced size. Accordingly, when the PLL 100 which is provided with such excellent features is used in a PLL frequency synthesizer circuit, for example, a mobile terminal which incorporates the synthesizer circuit is capable of following the input signal frequency over an extensive range of input frequencies with a circuit arrangement of a reduced scale.

Figure 9:
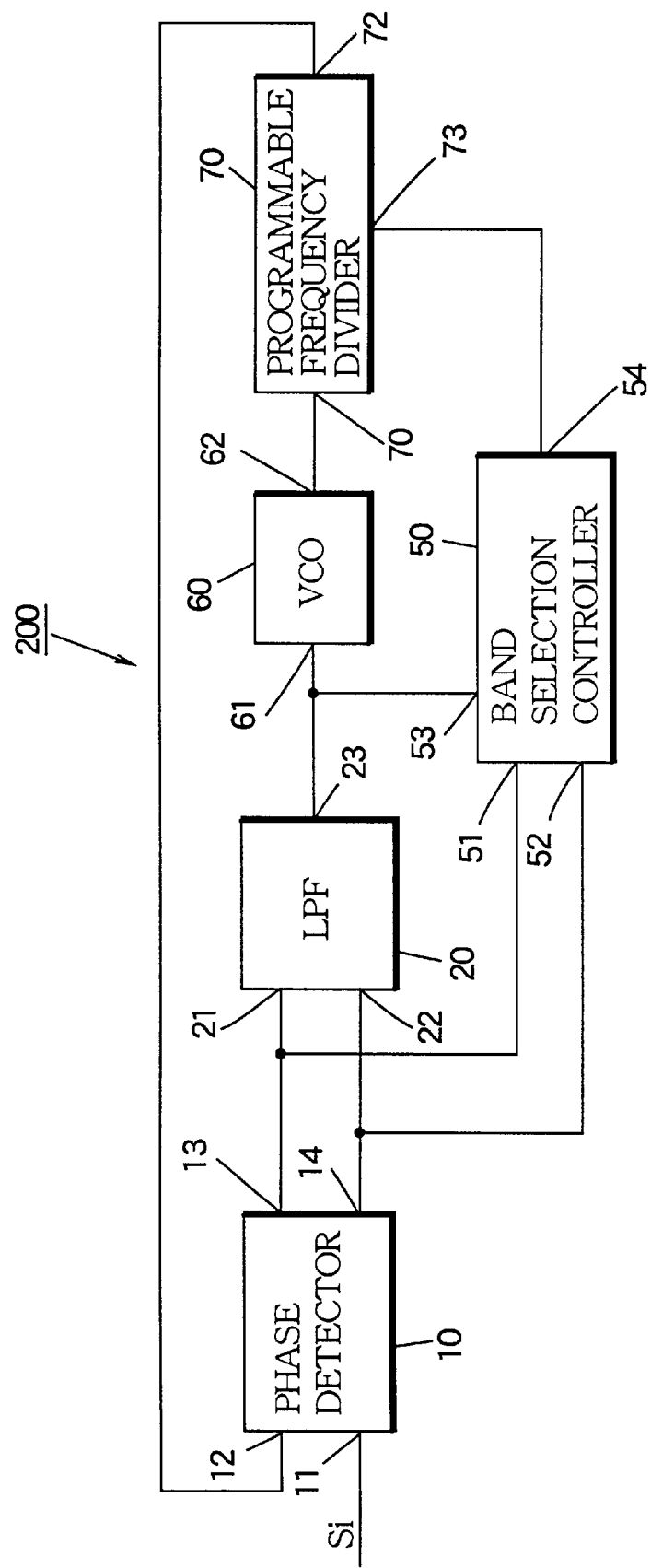
FIG. 9 is a circuit diagram of a PLL according to a second embodiment of the invention.

In the first embodiment, an arrangement is employed in which the oscillation band of the VCO 30 is switched. Alternatively, a frequency divider which can perform frequency division with a selected one of a plurality of frequency division factors may be employed, and the band selection signal Ss may be utilized to select the frequency division factor of the frequency divider 40. FIG. 9 shows such a second embodiment. In the following description of FIG. 9, it is to be noted that parts corresponding to those shown in the PLL 100 shown in FIG. 1 are denoted by like numerals as used before, and a corresponding description is omitted.

In FIG. 9, a PLL 200 comprises a phase detector 10, an LPF 20, a VCO 60, and a frequency divider, such as a programmable frequency divider 70, whose frequency division factor is selectable. The PLL 200 also comprises a band selection controller 50.

The programmable frequency divider 70 performs frequency division with a frequency division factor of M when the band selection signal Ss from the band selection controller 50 is Low. When the band selection signal Ss from the band selection controller 50 is High, the programmable frequency divider 70 performs frequency division with a frequency division factor of N which is smaller than M.

When the frequency division factor of the programmable frequency divider 70 changes from M to N, an output frequency from the programmable divider 70 is M/N times the frequency before the change. Accordingly, the combination of the VCO 60 and the programmable frequency divider 70 in FIG. 9 operates in the same way as the VCO 30 in FIG. 1.

As was described, the PLL 200 according to the second embodiment includes the programmable frequency divider 70, and the band selection controller 50 which operates to deliver the band selection signal Ss by monitoring the outputs from the phase detector 10 and the output from the LPF 20, and accordingly changes the frequency division factor of the programmable frequency divider 70. Accordingly, there is obtained a PLL which is capable of following the input frequency over an extensive range without incurring an increase in the size of the circuit arrangement, in the same way as in the first embodiment.

In addition, the phase detector, the LPF, the VCO and the frequency divider which are used to constitute the PLL are not limited to any particular variety or in number as illustrated in the described embodiments. For instance, in place of the VCO which is used in the first embodiment and which can operate with a selected one of the two oscillation bands, a VCO which can operate with a selected one of three or more oscillation bands may be used. Similarly, in place of the frequency divider which is used in the second embodiment, and which can perform the frequency division with a selected one of the two frequency division factors, a frequency divider which can perform the frequency division with a selected one of three or more frequency division factors may be used. In such cases, the band selection controller should be able to produce a band selection signal which can assume as many states or values as the oscillation bands (of the VCO) or the frequency division factors (of the frequency divider), so that it can select one of the oscillation bands or frequency division factors.

As described above, the PLL according to each of the embodiments may be applied to a PLL frequency synthesizer circuit, for example, but it should be understood that the application of the PLL is not limited thereto, but the PLL is applicable to any arrangement, such as a synchronization signal generator of various types of receivers, which utilize a PLL.

What is claimed is:

1. A PLL comprising:

a phase detector operable to produce a comparison output;

a low-pass filter;

a voltage-controlled oscillator operable to produce an output with a frequency that varies responsive to an output of said low-pass filter, said voltage-controlled oscillator having an oscillation band that can be switched;

a frequency divider operable to receive the output of said voltage-controlled oscillator; and a band selection controller operable to monitor the comparison output from said phase detector and the output of said low-pass filter so as to deliver a band selection signal which is effective to switch the oscillation band of said voltage-controlled oscillator;

wherein said voltage-controlled oscillator has an oscillation circuit including an oscillation capacitor, with a capacitance value, coupled to a plurality of inverters with respective threshold voltages, and a control circuit operable to control said oscillation circuit in accordance with the band selection signal, said control circuit being operable to change the frequency of the output of said voltage-controlled oscillator in accordance with a current flow which charges or discharges said oscillation capacitor, the capacitance value of said capacitor, and a difference in voltage of the threshold voltages between said plurality of inverters.

2. The PLL according to claim 1, wherein said voltage-controlled oscillator is arranged so as to augment the current to said oscillation capacitor by a given amount in response to the band selection signal.

3. A PLL comprising:

a phase detector operable to produce a comparison output;

a low-pass filter operable to receive the comparison output;

a voltage-controlled oscillator operable to produce an output with a frequency that varies responsive to an output of said low-pass filter;

a frequency divider having a frequency division factor that is selectable, said frequency divider being operable to receive the output of the voltage-controlled oscillator; and a band selection controller operable to monitor the comparison output from said phase detector and the output of said low-pass filter so as to deliver a band selection signal which is effective to switch the frequency division factor of said frequency divider.

* * * * *